United States Patent
Tseng et al.

(10) Patent No.: US 11,791,354 B2
(45) Date of Patent: Oct. 17, 2023

(54) METHOD AND APPARATUS FOR REDUCING LIGHT LEAKAGE AT MEMORY NODES IN CMOS IMAGE SENSORS

(71) Applicant: Taiwan Semiconductor Manufacturing Co., Ltd., Hsin-Chu (TW)

(72) Inventors: Chih-Yu Tseng, Hsin-Chu (TW); Ming-Hsien Chen, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 193 days.

(21) Appl. No.: 16/870,314

(22) Filed: May 8, 2020

(65) Prior Publication Data

US 2021/0351215 A1    Nov. 11, 2021

(51) Int. Cl.
| | |
|---|---|
| *H01L 27/146* | (2006.01) |
| *H04N 25/53* | (2023.01) |
| *H04N 25/711* | (2023.01) |
| *H04N 25/771* | (2023.01) |
| *H04N 25/75* | (2023.01) |
| *H04N 25/709* | (2023.01) |
| *H04N 25/71* | (2023.01) |

(52) U.S. Cl.
CPC .. *H01L 27/14623* (2013.01); *H01L 27/14612* (2013.01); *H01L 27/14636* (2013.01); *H01L 27/14643* (2013.01); *H01L 27/14685* (2013.01); *H01L 27/14689* (2013.01); *H04N 25/53* (2023.01); *H04N 25/711* (2023.01); *H04N 25/771* (2023.01); *H04N 25/709* (2023.01); *H04N 25/745* (2023.01); *H04N 25/75* (2023.01)

(58) Field of Classification Search
CPC ......... H01L 27/14623; H01L 27/14612; H01L 27/14636; H01L 27/14643; H01L 27/14685; H01L 27/14689; H01L 27/14627; H01L 27/14621; H01L 27/14625; H04N 5/37206; H04N 5/37452
See application file for complete search history.

(56) References Cited

U.S. PATENT DOCUMENTS

| | | |
|---|---|---|
| 9,893,104 B2 | 2/2018 | Kobayashi et al. |
| 2011/0242386 A1 | 10/2011 | Machida |

(Continued)

FOREIGN PATENT DOCUMENTS

TW    202015225 A    4/2020

*Primary Examiner* — Nelson Garces
(74) *Attorney, Agent, or Firm* — Duane Morris LLP

(57) ABSTRACT

Disclosed is a CMOS image sensor with global shutters and a method for fabricating the CMOS image sensor. In one embodiment, a semiconductor device, includes: a light-sensing region; a charge-storage region; a light-shielding structure; and at least one via contact; wherein the charge-storage region is spatially configured adjacent to the light-sensing region in a lateral direction, wherein the light-shielding structure is configured over the charge-storage region in a vertical direction so as to prevent incident light leaking from the light-sensing region to the signal-processing region, wherein the light-shielding structure is configured in an interlayer dielectric (ILD) layer, and wherein the light-shielding structure is simultaneously formed with the at least one via contact.

20 Claims, 16 Drawing Sheets

(56) References Cited

U.S. PATENT DOCUMENTS

| | | | |
|---|---|---|---|
| 2012/0299066 A1* | 11/2012 | Kato | H01L 27/14685 |
| | | | 257/E31.124 |
| 2017/0098676 A1 | 4/2017 | Kobayashi et al. | |
| 2018/0213169 A1* | 7/2018 | Onuki | H04N 5/37452 |
| 2018/0286905 A1 | 10/2018 | Tsao et al. | |
| 2019/0067353 A1* | 2/2019 | Tsao | H01L 27/14625 |
| 2020/0105816 A1 | 4/2020 | Chung et al. | |

* cited by examiner

METHOD AND APPARATUS FOR REDUCING LIGHT LEAKAGE AT MEMORY NODES IN CMOS IMAGE SENSORS

BACKGROUND

Global shutter (GS) complementary metal oxide semiconductor (CMOS) image sensors have been widely adopted in various applications because of the numerous advantages, including simultaneous pixel exposure and readout allowing for much higher quality imaging especially at high speeds, high frame rates, and high resolution. One of the implementation of the GS CMOS image sensor is the use of memory-in-pixel approach, which each pixel of the GS CMOS image sensor, in addition to a photodiode and readout circuitry, contains an extra memory node to temporarily store photo-generated charges generated by the photodiode. Using this approach, all the pixels in the CMOS image sensor start an exposure at the same time. At the end of the exposure, photo-generated charges are globally transferred from photodiodes to corresponding memory nodes and readout from the corresponding memory node through a traditional row-by-row scanning. A pixel-level memory node receives photo-generated charges from a corresponding photodiode and allows them to accumulate, eliminating the need for rolling shutter pulses.

Parasitic light or light leakage to the memory node or the block substrate due to mechanisms like diffraction and scattering can also generate photo-generated charges which then contaminate the stored charges in the memory node and cause artifacts. Contamination caused by the parasitic light to the photo-generated charges from the photodiode and stored in the memory node needs to be minimized before being readout for high image quality. Current technologies using a metal light-shielding engineered on the memory node provide limited improvement and may cause plasma damage to the memory node during the fabrication process. Therefore, there exists a need to develop a method to reduce the parasitic light to memory nodes in GS CMOS image sensors.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of illustration.

DETAILED DESCRIPTION OF EXEMPLARY EMBODIMENTS

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

This disclosure presents various embodiments of a metal light-shielding for a signal processing region of a pixel in a Global Shutter Complementary Metal Oxide Semiconductor (CMOS) image sensor to reduce light leakage to the processing region so as to remove artifacts and improve signal-to-noise ratio.

Figure 1:
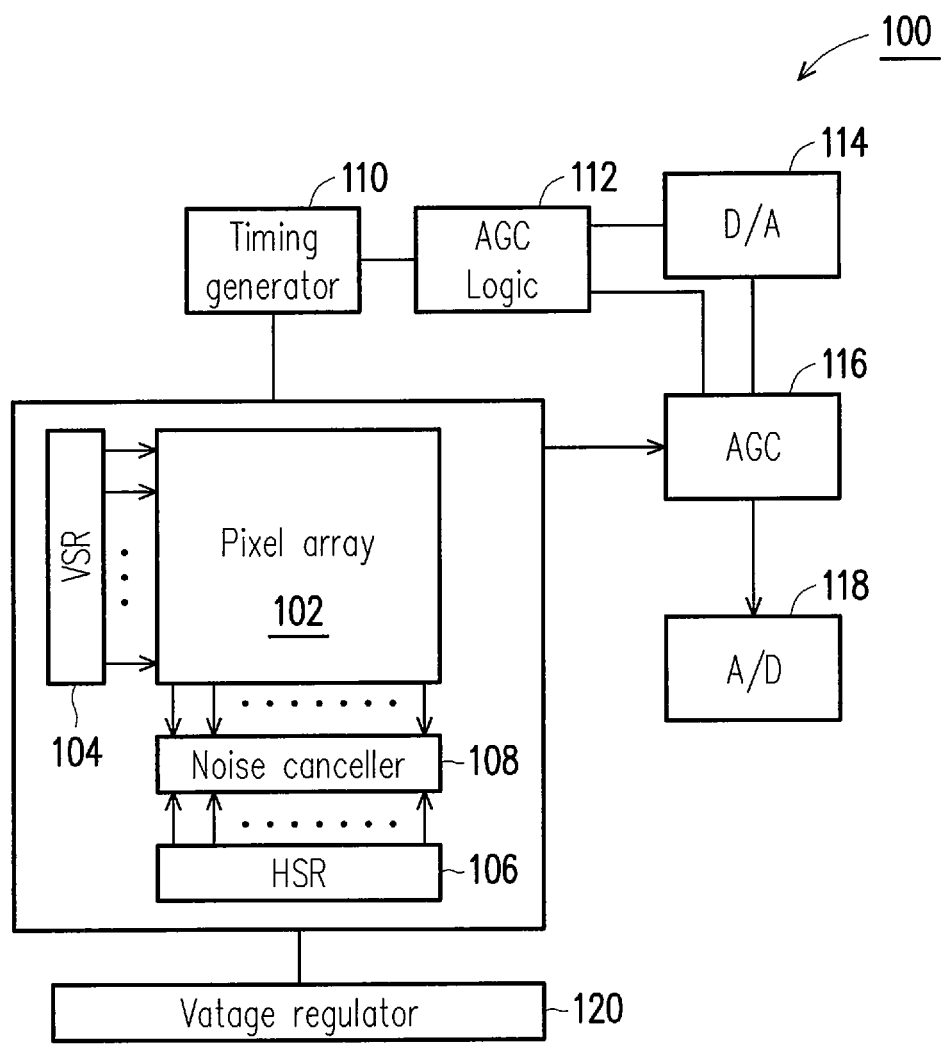
FIG. 1 illustrates an exemplary block diagram of a Global Shutter (GS) Complementary Metal Oxide Semiconductor (CMOS) image sensor (CIS), in accordance with some embodiments of present disclosure.

FIG. 1 illustrates an exemplary block diagram of a Complementary Metal Oxide Semiconductor (CMOS) image sensor (CIS) 100, in accordance with some embodiments of present disclosure. It is noted that the CIS 100 is merely an example, and is not intended to limit the present disclosure. Accordingly, it is understood that additional functional blocks may be provided in or coupled to the CIS 100 of FIG. 1, and that some other functional blocks may only be briefly described herein.

In the illustrated embodiment of FIG. 1, the CIS 100 comprises a pixel array 102, a vertical shift register (VSR) 104, a horizontal shift register (HSR) 106, a noise canceller 108, a timing generator 110, an automatic gain control (AGC) logic 112, a digital-to-analog (D/A) convertor 114, an AGC 116, an analog-to-digital (A/D) convertor 118, and a voltage regulator 120. The pixel array 102 comprises a plurality of active pixels that are arranged in a column-row configuration, as discussed in further detail in FIG. 2. In some embodiments, the CIS 100 is a CIS with global shutters. Specifically, each of the plurality of active pixels of the pixel array 102 comprises a CMOS photodiode, a memory node, and a plurality of transistors. In some embodiments, the pixel array 102 may further comprises a plurality of dummy pixels arranged at the boundary of active pixels, serving as the optical dummy in order to ensure that active pixels at the boundary have the same performance as the rest of the active pixels.

In some embodiments, the memory node in each of the plurality of active pixels comprises a floating diffusion capacitor. In some other embodiments, the memory node further comprises a diode. In some embodiments, the plurality of transistors in each of the plurality of active pixels are used for at least one of the following: transferring photo-generated charges to the memory node of a corresponding CMOS photodiode, resetting the photodiode for receiving a new exposure, resetting the memory node of the corresponding CMOS photodiode for receiving photo-generated charges from the new exposure, and enabling an active pixel for signal output.

In some embodiment, the vertical shift register (VSR) 104 is configured to perform at least one of the following functions, including receiving a row address of the pixel array 102 from the timing generator 110, and driving controlling lines of the pixel array 102. In some embodiments, the horizontal shift register (HSR) 106 is to perform reading out output signals column by column. The VSR 104 and the HSR 106 each is coupled to the pixel array 102. In the illustrated embodiment the HSR 106 is coupled to the pixel array 102 through a noise canceler 108, wherein the noise canceller 108 is a circuit to remove noise from output signals.

In some embodiment, the timing generator 110 generates a clock signal to synchronize the output signals from the pixel array 102. The auto gain control (AGC) 116 is a system to tune the amplitude of the output signals. In the illustrated embodiment, the AGC 116 is coupled to the AGC logic 112 which provides control to the AGC 116. In some embodiments, the AGC 116 is further coupled to the D/A convertor 114, which converts digital signals to analog signals. The AGC 116 may further coupled to the pixel array 102, the VSR 104, the HSR 106 and the noise canceller 108. In the illustrated embodiment, the AGC 116 is coupled to the A/D convertor 118, which converts analog signals to digital signals. In some embodiments, the voltage regulator 120 is coupled to the pixel array 102, the VSR 104, the HSR 106 and the noise canceller 108, providing voltage control and maintaining a constant voltage level to the coupled components.

Figure 2A:
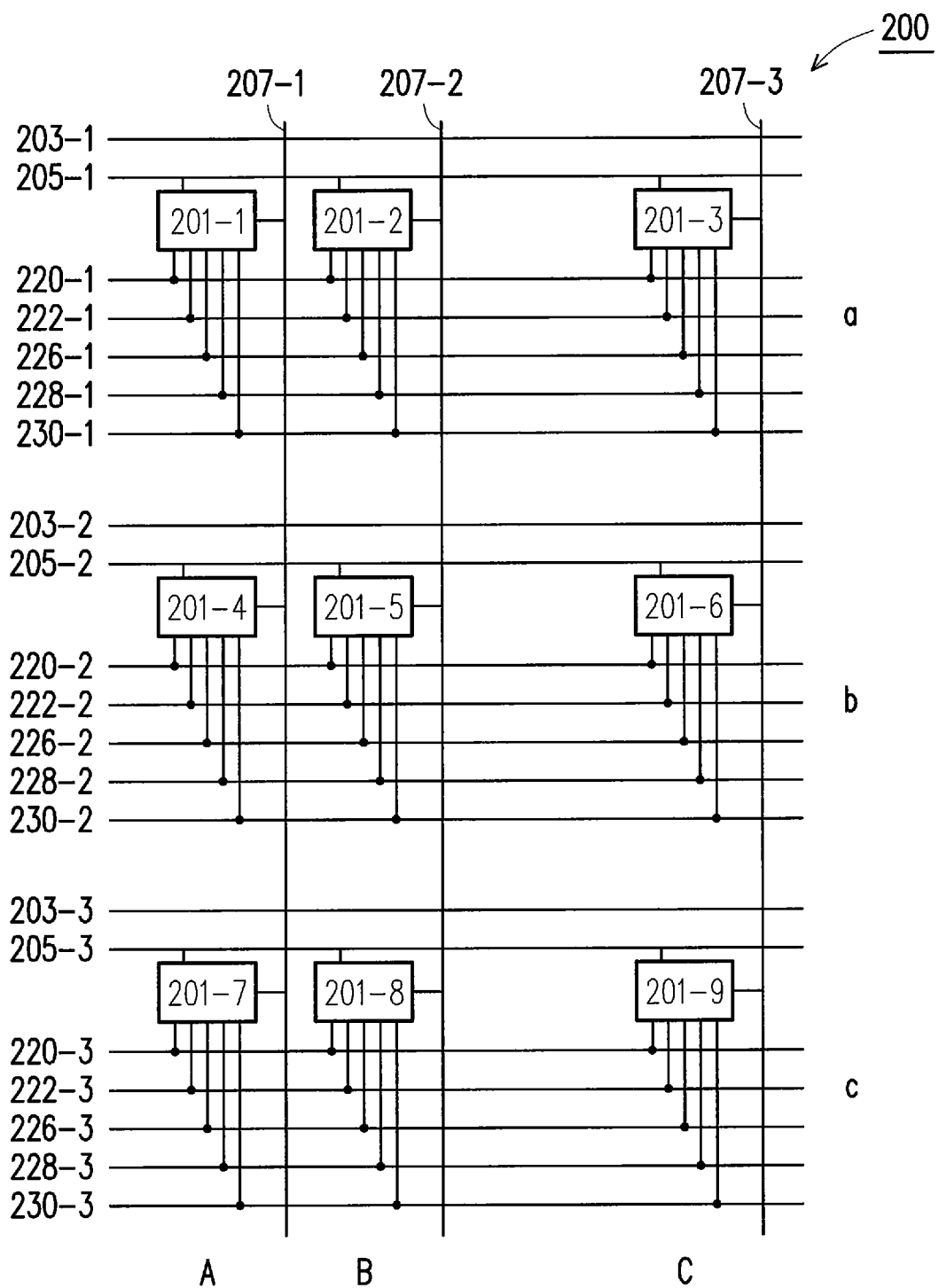
FIGS. 2A and 2B illustrate an exemplary circuit diagram of a pixel array comprising a plurality of pixels, in accordance with some embodiments of present disclosure.

FIG. 2A illustrates an exemplary circuit diagram of a pixel array 200 of a CMOS image sensor (CIS) 100, in accordance with some embodiments of present disclosure. In the illustrated embodiment, the pixel array 200 of the CIS 100 includes a plurality of active pixels 201-1, 201-2, 201-3, 201-4, 201-5, 201-6, 201-7, 201-8, and 201-9. Although only 9 active pixels are shown, any desired number of active pixels may be included in the pixel array 200 while remaining within the scope of the present disclosure. As described above, the active pixel 201-1, 201-2, 201-3, 201-4, 201-5, 201-6, 201-7, 201-8, and 201-9, are arranged in a column-row configuration. More specifically, in some embodiments, the pixel array 102 includes voltage control lines from a vertical shift register (VSR) 104 and readout lines 207-1, 207-2, and 207-3. In some embodiments, the pixel array 200 also includes positive supply voltage power (VDD) 203-1, 203-2, and 203-3, and zero voltage reference (GND) 205-1, 205-2, and 205-3. As such, the pixel array 200 may include a first plurality of columns (e.g., arranged vertically), a second plurality of rows (e.g., arranged horizontally), wherein each column includes a respective pair of VDD 203, GND 205, readout line 207, and each row includes a respective VDD 203, GND 205, and voltage control lines, i.e., G_RST 220, TX 222, RST 226, OP 228 and R_SEL 230. In the illustrated embodiments, the 9 bit cells 201 in the pixel array 200 each may also provide corresponding data outputs directly through corresponding readout line 207.

For example, as shown in the illustrated embodiment of FIG. 2A, the pixel array 102 includes columns "A," "B," and "C," and rows "a," "b," and "c," wherein column A includes respective readout line 207-1; column B includes respective readout line 209-2; column C includes respective readout line 207-3; row a includes a respective VDD 203-1, GND 205-1, voltage control line 209-1; row b includes a respective VDD 203-2, GND 205-2, voltage control line 209-2; and row c includes a respective VDD 203-3, GND 205-3, voltage control line 209-3.

In the illustrated embodiment, each row comprises 5 control lines, G_RST 220, RST 226, OP 228, TX 222, and R_SEL 230. In some embodiments, as discussed in detail below, the 5 control lines is to provide control signals to the gate of five transistors in each of the pixels of the row. Specifically, row a includes a respective G_RST 220-1, RST 226-1, OP 228-1, TX 222-1, and R_SEL 230-1; row b includes a respective G_RST 220-2, RST 226-2, OP 228-2, TX 222-2, and R_SEL 230-2; and row c includes a respective G_RST 220-3, RST 226-3, OP 228-3, TX 222-3, and R_SEL 230-3.

As described above, each active cell of the pixel array 102 (e.g., 201-1, 200-2, 201-3, 201-4, 200-5, 201-6, 200-7, 201-8, 201-9, etc.) may include a plurality of transistors, which is discussed in detail below in FIG. 2B. It should be also noted that FIG. 2A is only an example for illustration purposes and is not intended to be limiting. The type of signal lines in a pixel array 102 in in this present disclosure can be arranged in different ways depending on the circuit layout design and types of bit cells used in the array.

Figure 2B:
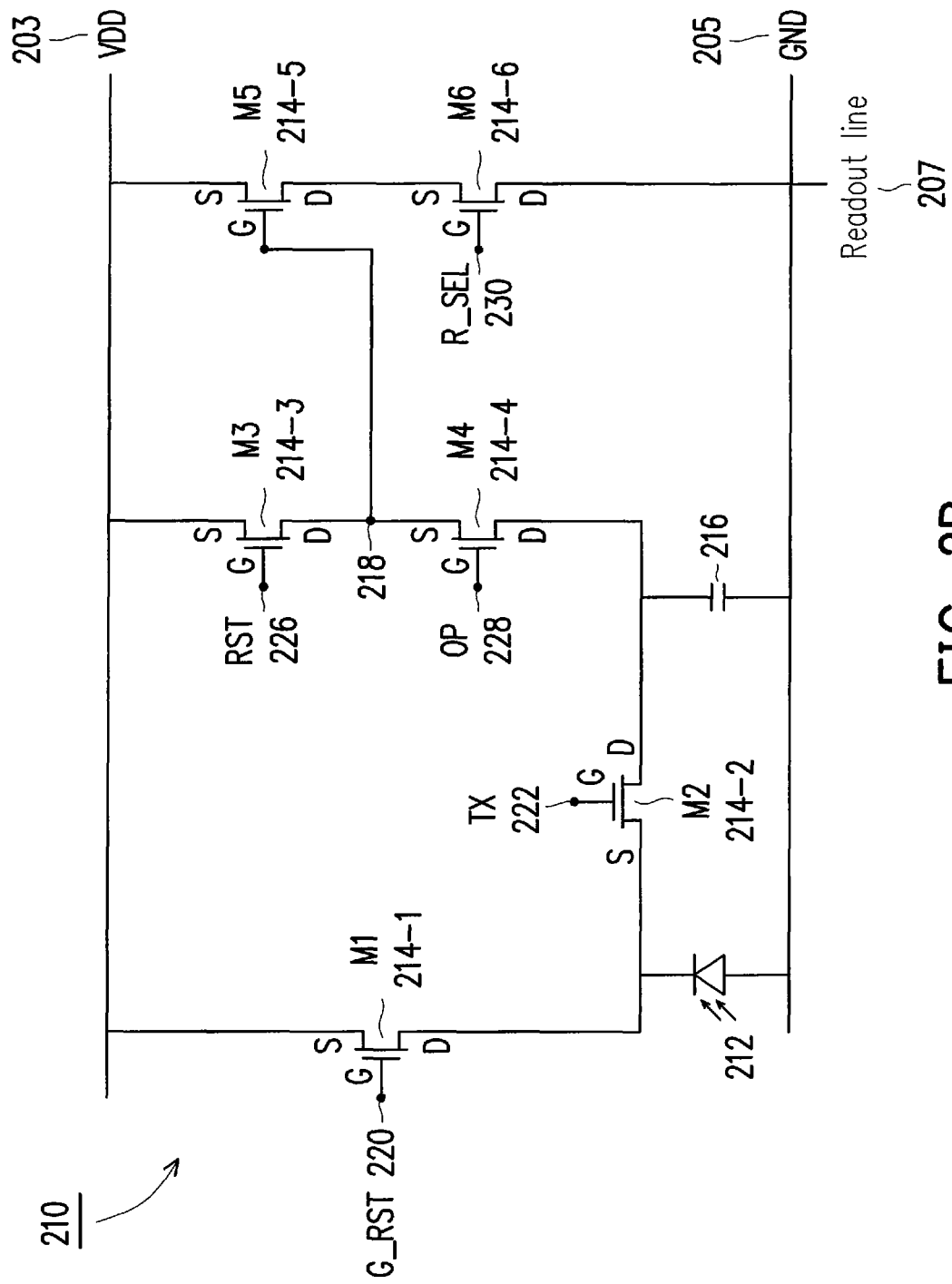

FIG. 2B illustrates an exemplary circuit diagram of an active pixel 210 in a pixel array 200 of a CIS 100, in accordance with some embodiments of the present disclosure. In the illustrated embodiment, the active pixel 210 comprises a photodiode 212, 6 transistors: M1 214-1, M2 214-2, M3 214-3, M4 214-4, M5 214-5, and M6 214-6. In some embodiments, each of the 6 transistors in the active pixel 200 comprises a PMOS (p-type metal-oxide-semiconductor) transistor. Although the illustrated embodiments of FIG. 2B shows that M1-M6 are PMOS transistors, any of a variety of transistors or devices that are suitable for use in a memory device may be implemented as at least one of M1-M6 such as, for example, a NMOS a bipolar junction transistor (BJT), a high-electron mobility transistor (HEMT), etc.

The active pixel 210 may further comprise a capacitor 216. In some embodiments, the transistors M1 214-1 and M3 214-3 are reset transistors. In some embodiments, the transistor M1 214-1 is a global reset gate and the transistor M3 214-3 is a reset gate.

In some embodiments, source terminals of the transistors M1 214-1, M3 214-3 and M5 214-5 are coupled to VDD 203. Drain terminal of the transistor M1 214-1 is further coupled to the photodiode 212, wherein one of the terminals of the photodiode 212 is coupled to GND 205. The drain terminal of the transistor M1 214-1 is further coupled to source terminal of the transistor M2 214-2. Drain terminals of the transistors M2 214-2 and M4 214-4 are coupled together to GND through the capacitor 216. Drain terminal of the transistor M3 214-3 and source terminal of the transistor M4 214-4 are coupled together at node 218. Drain terminal of the transistor M5 214-5 and source terminal of the transistor M6 214-6 are coupled together. In some embodiments, gate terminal of the transistor M5 214-5 is coupled to the nodes 218. Drain terminal of the transistor M6 214-6 is coupled to the readout line 207. Gate terminals of the transistors M1 214-1, M2 214-2, M3 214-3, M4 214-4 and M6 214-6 are coupled to a first control line (G_RST) 220, a second control line (TX) 222, a third control line (RST) 226, a fourth control line (OP) 228, and a fifth control line (R_SEL) 230, respectively.

When sensing, a voltage on the G_RST switching from low to high turns on the transistor M1 214-1 so as to reset the photodiode 212. The photodiode 212 then receives light signals and photon-induced charge carriers are generated within the photodiode 212. The voltage on the TX is then switched from low to high so as to turn on the transistor M2 214-2, while the voltage on the OP is kept low so as to turn off the transistor M4 214-4. The photon-inducted charge carriers are then directed to the capacitor 216 (i.e., storage node of the active pixel) through the transistor M2 214-2. As discussed in detail below in FIGS. 3A-B, the capacitor 216 is covered by a light-shielding structure to prevent light induced noises.

When reading a background signal, the voltage on the OP is kept low to keep the transistor M4 214-4 off and the voltage on the RST is switched from low to high so as to turn on the transistor M3 214-3, which pulls up the voltage level at the node 218 from low to high. The voltage on the node 218 is then able to turn on the transistor M5 214-5. The voltage on the R_SEL is then switched from low to high so as to read a background signal to the readout line 207.

When reading the stored photo-inducted charge carriers out to the readout line 207, the voltage on the RST is then switched from high to low; the voltage on the OP is switched from low to high; and the voltage on the R_SEL is kept high so as to read out the signal stored on the storage node to the readout line 207.

Figure 3A:
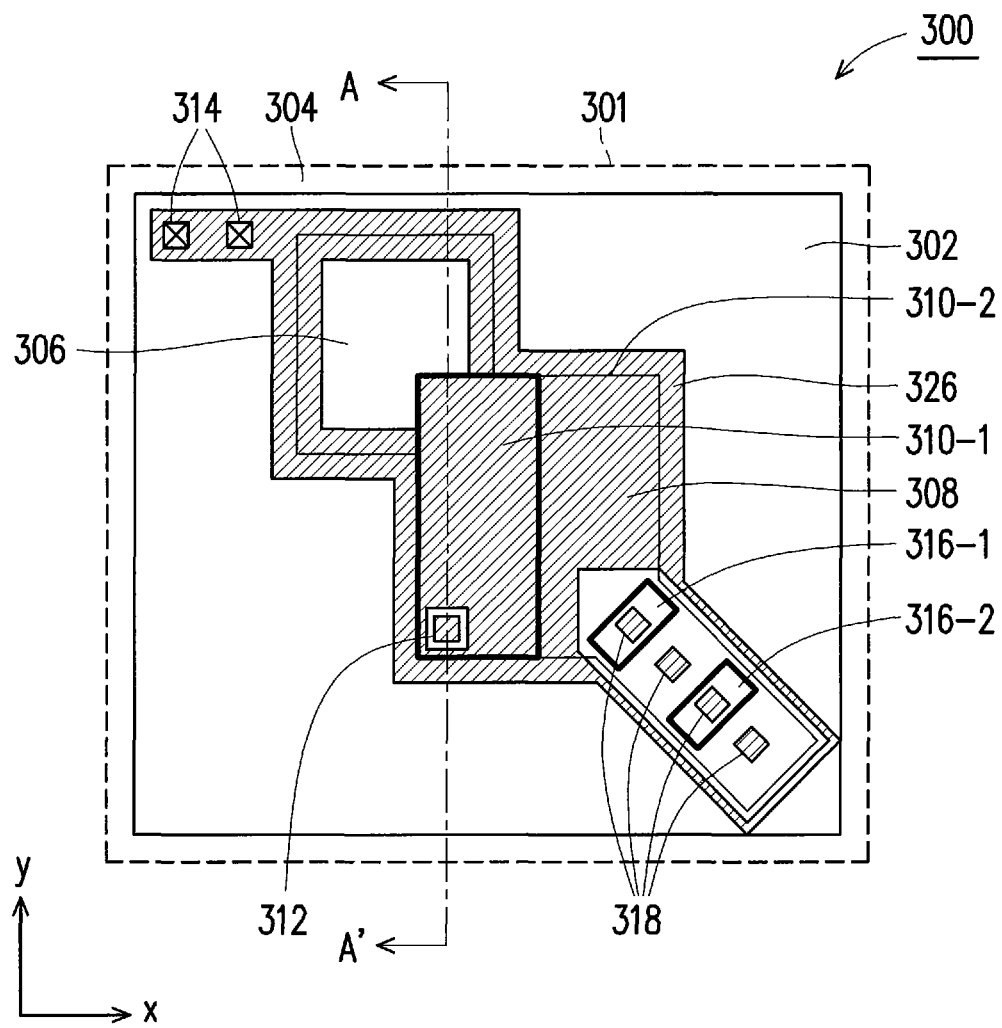
FIG. 3A illustrates an exemplary top views of a pixel in a pixel array in a Global Shutter Complementary Metal Oxide Semiconductor (CMOS) image sensor (CIS), in accordance with some embodiments of the present disclosure.

FIG. 3A illustrates an exemplary top view of a portion of an active pixel 300 in a pixel array 200 of a CIS 100, in accordance with some embodiments of the present disclosure. In the illustrated embodiment, the active pixel 300 in a pixel array 102 of a CIS 100 comprises an active region 302 and an insulation region 304 within a pixel boundary 301. In some embodiments, the insulation region 304 comprises deep trench isolation (DTI) structures or shallow trench isolation (STI) structures separating neighboring active pixels to reduce noise and crosstalk. In some embodiments, the size of the active pixel is 1.4×1.4 to 5.5×5.5 micrometers square. In some embodiments, the ratio between a first area of the active region 302 and a second area of the isolation region 304 is in a range of 0.5 to 0.8.

In some embodiments, the active region 302 of the active pixel 201 comprises at least a light sensing region 306 and a charge storage region 308. In the illustrated embodiment, the charge storage region 308 is configured adjacent to the light sensing region and overlaps with the light sensing region 306. The overlapping area of the light sensing region 306 and the charge storage region 308 is determined by the area of a transfer gate which is used to transfer the photo-generated charges from the light sensing region 306 to the charge storage region 308. In some embodiments, the ratio between the area of the light sensing region 306 and the area of the charge storage region 308 is in a range of 1.5 to 2.5. In some other embodiments, the ratio between the area of the light sensing region 306 and the area of the charge storage region 308 is 1.5 to 2.5.

In some embodiments, the light sensing region 306 comprises a photodiode (not shown). In some embodiments, the photodiode is a CMOS photodiode. In some other embodiments, the light sensing region 306 may further comprise at least one light guide structure to guide the incident light to the photodiode, wherein the at least one light guide structure comprises high refractive index materials. In some embodiments, the refractive index and dimensions of the at least one light guide structure are designed and selected according to the dimension and wavelength range of the photodiode. In some other embodiments, the light sensing region 306 may further comprises filters for color imaging, micro-lenses and anti-reflection (AR) coating for improved light collection. In some embodiments, the CMOS photodiode in the light sensing region 306 detects light directed from an object surface. In some embodiments, the CMOS photodiode converts the light into an electric current signal using a semiconductor p-n junction or a p-i-n junction. In some embodiments, the CMOS photodiode is buried photodiode or a pinned photodiode, wherein the pinned photodiode comprises a deep n-type implant in a p-type substrate and a heavily doped p-type layer in the deep n-type implant region so as to pin the surface, which can provide advantages such as low noise, high quantum efficiency and low dark current. It should be noted that the CMOS photodiode in the light sensing region 306 also comprises electrical contacts, which are not illustrated in the pixel 300 for clarity purposes.

In some embodiments, the charge storage region 308 comprises a transfer gate 310-1, a memory node 310-2, and a light-shielding structure 336. In some embodiments, the transfer gate 310-1 is electrically coupled through a via contact 312. In some embodiments, the light-shielding structure 336 in the charge storage region 308 of the pixel 300 is to provide light isolation so as to reduce charge contamination caused by parasitic light and improve global shutter efficiency. In some embodiments as described in detail below, the light-shielding structure 336 comprises tungsten (W) metal and is configured above the charge storage region 308 to prevent incident light from reaching the transfer gate 310-1 or the memory node 310-2. In some embodiments, to prevent electrostatic charging on the light-shielding structure 336 supported by an interlayer dielectric (ILD) layer, which are discussed in further detail below in FIG. 3B, the light-shielding structure 336 is grounded through grounding contacts 314.

In some embodiments, the charge storage region 308 further comprises a plurality of transistors. For example, in the illustrated embodiment, the charge storage region 308 comprises 2 functional gates 316-1/316-2 to transfer the photo-generated carriers that are stored in the storage node to outside circuits and/or device. The functional gates 316-1/316-2 are coupled with corresponding contacts 318. In some embodiments, the memory node 310-2 is a floating diffusion node. In some embodiments, the memory node 310-2 further comprises a diode with heavily doped p and n regions for a low dark current.

In some embodiments, the active pixel 300 may further comprise a plurality of transistors including a reset (RST) Metal-Oxide-Semiconductor Field-Effect Transistor (MOSFET) used to reset a sense node converts the charge to voltage according to its intrinsic capacitance, a source follower (SF) MOSFET used to perform the in-pixel amplification, and a row select switch (RS) MOSFET used to connect the pixel to the column sample-and-hold stage. In some embodiments, when the CMOS photodiode is a pinned photodiode, a transfer gate (TG) MOSFET is need during integration to the sense node. The embodiment illustrated in FIG. 3A is an example and is not intended to be limiting. It should be noted that the active pixel can comprise any number of transistors and any type of photodiode in any layout design, which are within the scope of this invention.

It should be noted that the via contact 312 to the transfer gate 310-1, the grounding contacts 314, the function gates 316 and the corresponding electrical contacts 318 in the active pixel 300 is for illustration purposes and is not intended to be limiting. Any layout design of the active region 302, isolation region 304, the charge storage region 308, the light-sensing region 306, the light-shielding structure 336, and the plurality of transistors/contacts are within the scope of this invention.

Figure 3B:
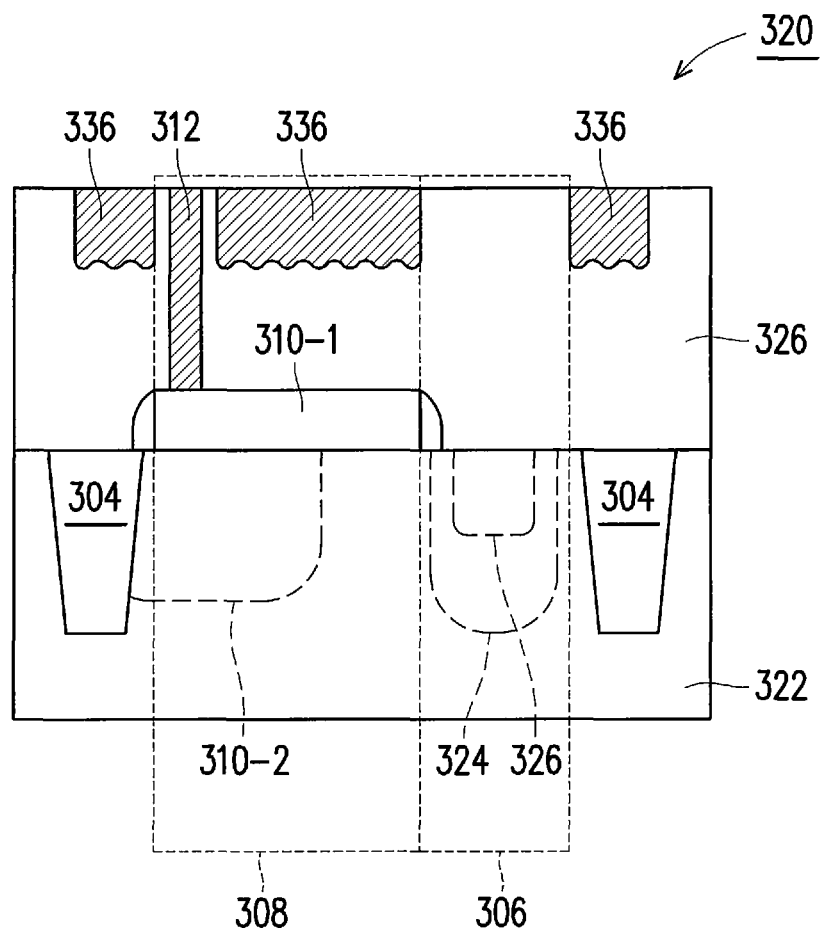
FIG. 3B illustrates an exemplary cross-sectional views of a pixel in a pixel array in a Global Shutter Complementary Metal Oxide Semiconductor (CMOS) image sensor (CIS), in accordance with some embodiments of the present disclosure.

FIG. 3B illustrates an exemplary cross-sectional view 320 of a portion of an active pixel 300 in a pixel array 200 of a CIS 100, in accordance with some embodiments of the present disclosure. In the illustrated embodiment, the exemplary cross-sectional view 320 is taken at a plane (section A-A') that cuts vertically through the CIS 100 showing in FIG. 3A. In some embodiments, the pixel array 200 is fabricated on a substrate 322. In some embodiments, the substrate 322 comprises a lightly-doped p-type silicon wafer. In some embodiments, the pixel 300 comprises a light-sensing region 306 and a charge-storage region 308. In some embodiments, the light-sensing region 306 comprises a CMOS diode with a deep n-type implant region 324 and a pinned surface p-type region 326. In some embodiments, the charge-storage region 308 comprises a transfer gate 310-1, a memory node 310-2, and a light-shielding structure 336, wherein the light-shielding structure 336 is configured above the charge storage region 308 so as to prevent incident light from reaching the storage gate 310-1 or the memory node 310-2.

In some embodiments, the light-shielding structure 336 is fabricated in and separated from the transfer gate 310-1 by an interlayer dielectric (ILD) layer 326. In the illustrated embodiments, the top surfaces of the light-shielding structure 336 and the ILD layer 326 are coplanar. In some embodiments, the bottom surface of the light-shielding structure 336 comprises wrinkles, wherein the depth, geometry and location of the wrinkles are controlled and created by an interference photolithographic and subsequent dry-etching process as discussed in further detail below in FIGS. 5 and 6. In some embodiments, the light-shielding structure 336 is fabricated simultaneously with a via contact 312 to transfer gate 310-1, via contacts 318 to the function gates 316 (FIG. 3A), via contacts (not shown) to the CMOS photodiode, and grounding contacts 314. Therefore, the fabrication of the light-shielding structure 336 in this present disclosure does not require a separate fabrication step and does not cause plasma damage to the transfer gate 310-1.

Figure 4:
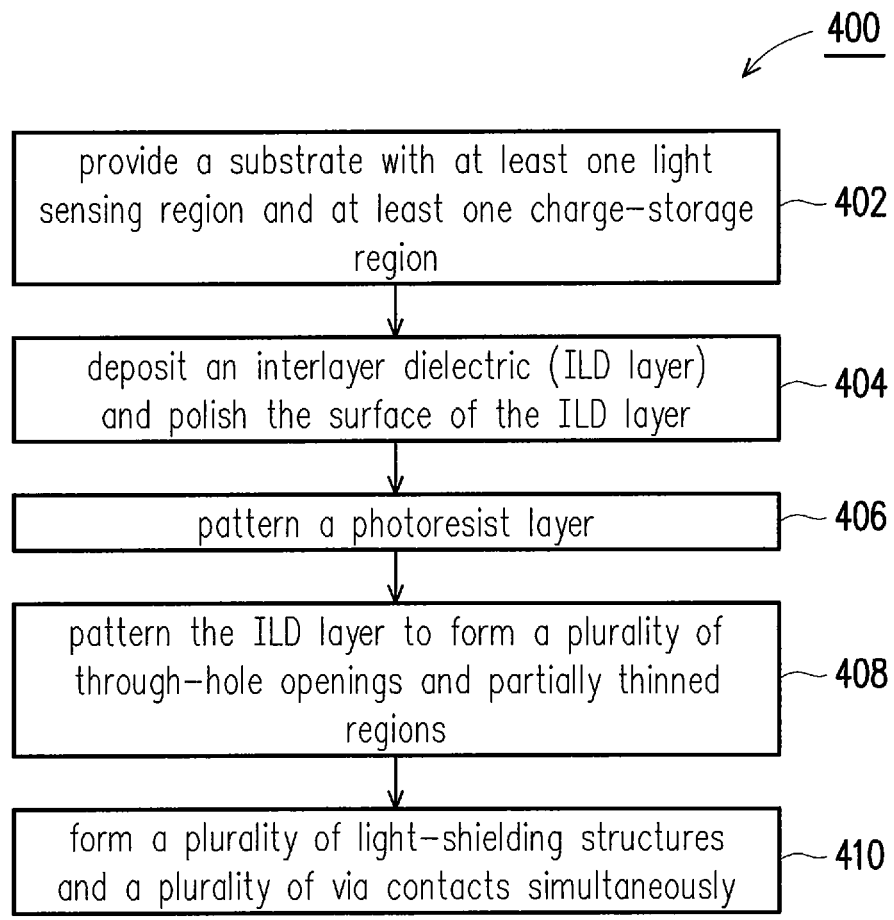
FIG. 4 illustrates a flow chart of an exemplary method for forming a metal light shielding over a memory node of a pixel in a global shutter Complementary Metal Oxide Semiconductor (CMOS) image sensor (CIS), in accordance with some embodiments of the present disclosure.

FIG. 4 illustrates a flowchart of a method 400 to form a pixel array 200 in a CIS 100, in accordance with some embodiments of the present disclosure. It is noted that the method 400 is merely an example, and is not intended to limit the present disclosure. Accordingly, it is understood that additional operations may be provided before, during, and after the method 400 of FIG. 4, and that some other operations may only be briefly described herein. In some embodiments, operations of the method 400 may be associated with cross-sectional views of a portion of a pixel of a pixel array 200 in a CIS 100 at various fabrication stages as shown in FIGS. 5A-5J, respectively, which will be discussed in further detail below.

Referring now to FIG. 4, the method 400 starts with operation 402 in which a substrate is provided according to some embodiments. In some embodiments, the substrate comprises at least one light-sensing region and at least one charge-storage region. In some embodiments, the fabrication of the at least one charge-storage region further comprises a deposition, patterning and etching of a polysilicon layer, an interfacial layer and a spacer layer to form at least one transfer gate structure over at least one corresponding storage node. In some embodiments, the interfacial layer is a silicon oxide layer and the spacer layer comprises oxynitride. The method 400 continues with operation 404 in which an interlay-dielectric (ILD) layer is formed on the surface of the substrate and the at least one transfer gate structure. In some embodiments, the ILD layer comprises silicon oxide and polished using a chemical-mechanical polishing process. The method 400 continues with operation 406 in which a photoresist layer is patterned according to some embodiments. In some embodiments, the photoresist layer is patterned to simultaneously define a plurality of via contacts, a plurality of grounding contacts, and a light-shielding structure. In some embodiments, the patterned photoresist layer comprises regions with completely removed photoresist layer for electrical contacts (e.g., the plurality of via contacts and grounding contacts) and regions with partially removed photoresist layer for the light-shielding structure. The method 400 continues with operation 408 in which the ILD layer is patterned using the patterned photoresist layer according to some embodiments. In some embodiments, the ILD layer is etched using the patterned photoresist layer as a hard mask. In some embodiments, the patterned ILD layer comprises regions with through-hole openings for via contact purposes and partially thinned regions for the light-shielding structure. In some embodiments, the partially thinned regions are aligned with the at least one charge-storage region in the substrate. The method 400 continues with operation 410 in which the light-shielding structure and the plurality of via contacts are formed simultaneously. In some embodiments, a metal layer is deposited and the patterned photoresist is removed according to some embodiments. In some embodiments, the metal layer comprises tungsten (W) metal. In some embodiments, the W layer also fills the through-hole openings in the ILD layer to form the plurality of via contacts and/or grounding contacts and the partially thinned regions to form the light-shielding structure over the at least one charge-storage region.

As mentioned above, FIGS. 5A-5G illustrate, in a cross-sectional view, a portion of a pixel 500 of a pixel array 200 in a CIS 100 at various fabrication stages of the method 400 of FIG. 4. Also, FIGS. 5A-5G are simplified for a better understanding of the concepts of the present disclosure, which is a method for fabricating a light-shielding structure for a GC CMOS image sensor. Although the figures illustrate the pixel 500, it is understood the pixel 500 may comprise a number of other devices such as signal lines, transistors, capacitors, light guides, via contacts, grounding contacts, STI structures, etc. as discussed in FIG. 3A, which are not completely shown in FIGS. 5A-5G, for purposes of clarity of illustration.

Figure 5A:
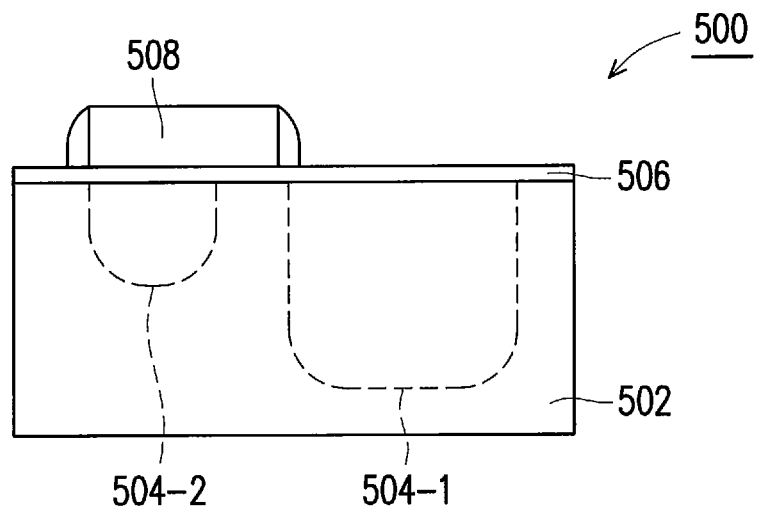
FIGS. 5A-5G illustrate cross-sectional views of a pixel in a global shutter Complementary Metal Oxide Semiconductor (CMOS) image sensor (CIS) with a metal light shielding over a memory node of the pixel, during various fabrication stages, in accordance with some embodiments of the present disclosure.

FIG. 5A is a cross-sectional view of a portion of a pixel 500 in a pixel array 200 in a CIS 100 including a substrate 502 at one of the various stages of fabrication corresponding to operation 402 of FIG. 4, in accordance with some embodiments of the present disclosure. The substrate 502 comprises at least two conductive regions 504. In some embodiments, the at least two conductive regions 504 are configured for sensing incident light and storing photo-generated charges. In some embodiments, a first conductive region 504-1 is a light-sensing region. In some embodiments, the light-sensing region 504-1 comprises a photodiode, wherein the photodiode in the light-sensing region 504-1 comprises a Complementary metal-oxide semiconductor (CMOS) photodiode. In some embodiments, the CMOS photodiode detects incident light directed from an object surface. In some embodiments, the CMOS photodiode converts the light into an electric current signal using a semiconductor p-n junction or a p-i-n junction, which are then directed to a second conductive region 504-2, wherein the second conductive region 504-2 is a charge-storage region.

In some embodiments, the substrate 502 is a silicon substrate. Alternatively, the substrate 502 may include other elementary semiconductor material such as, for example, germanium. The substrate 502 may also include a compound semiconductor such as silicon carbide, gallium arsenic, indium arsenide, and indium phosphide. The substrate 502 may include an alloy semiconductor such as silicon germanium, silicon germanium carbide, gallium arsenic phosphide, and gallium indium phosphide. In one embodiment, the substrate 502 includes an epitaxial layer. For example, the substrate 502 may have an epitaxial layer overlying a bulk semiconductor. Furthermore, the substrate 502 may include a semiconductor-on-insulator (SOI) structure. For example, the substrate 502 may include a buried oxide (BOX) layer formed by a process such as separation by implanted oxygen (SIMOX) or other suitable technique, such as wafer bonding and grinding.

In some embodiments, the conductive regions 504 includes regions in the substrate 502 implemented by a process such as ion implantation and/or diffusion. The conductive regions 504 include n-well, p-well, lightly doped region (LDD), heavily doped source and drain (S/D) contacts, and various channel doping profiles configured to form various integrated circuit (IC) devices. In some embodiments, the memory node 606 comprises a capacitor. The substrate 502 may further include other functional features formed in and on the substrate, which are not shown for clarification purposes. The substrate 502 further includes lateral isolation features provided to separate various devices formed in the substrate 502, for example shallow trench isolation (STI). The various devices in the substrate 502 further include silicide disposed on S/D, gate and other device features for reduced contact resistance and enhance process compatibility when coupled between devices through local interconnections.

Alternatively, the conductive region 504 may further comprise a silicide feature disposed on a source, drain or gate electrode typically from a sintering process introduced by at least one of the processes including thermal heating, laser irradiation or ion beam mixing. The silicide feature may be formed on polysilicon gate (typically known as "polycide gate") or by on source/drain (typically known as "salicide") by a self-aligned silicide technique. In another embodiment, the conductive region 504 may include an electrode of a capacitor or one end of a resistor.

In some embodiments, an interfacial layer 506 comprises silicon oxide. In some embodiments, the interfacial layer 506 comprises a material that is at least one of the following: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. In some embodiments, the interfacial layer 506 is deposited using plasma enhanced chemical vapor deposition (PECVD) with a silane gas as a precursor gas. In some other embodiments, the interfacial layer 506 is deposited using one of the following: a physical vapor deposition (PVD) process, a thermal oxidation process, and an atomic layer deposition (ALD) process.

In some embodiments, a transfer gate 508 is formed through a photolithographic process. A patterned photoresist layer is used to mask an etching of a conformal polySi layer to form the storage gate 508 which is configured over the charge-storage region 504-2 in the substrate 502. Accordingly, in some embodiments, the patterned photoresist layer is formed after a conventional patterning (e.g., photolithography) process, to align the transfer gate 508 to the conductive regions 504 in the substrate 502. In some embodiments, the polySi layer is etched by a dry and/or wet etching process using the patterned first photoresist layer as the hard mask.

In some embodiments, the transfer gate 508 further comprises a spacer layer comprising a material that is least one of the following: silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. In some embodiments, the spacer layer is deposited using plasma enhanced chemical vapor deposition (PECVD) with a silane gas as a precursor gas. In some other embodiments, the spacer layer is deposited using a physical deposition process, e.g., sputtering and evaporation. In some embodiments, the spacer layer is deposited using an atomic layer deposition (ALD) process. In some embodiments, the spacer layer has a thickness equal to or greater than 100 nanometers. In some embodiments, the spacer layer is patterned only covering a portion of the interfacial layer 506 and around the transfer gate 508 as shown in FIG. 5A.

Figure 5B:
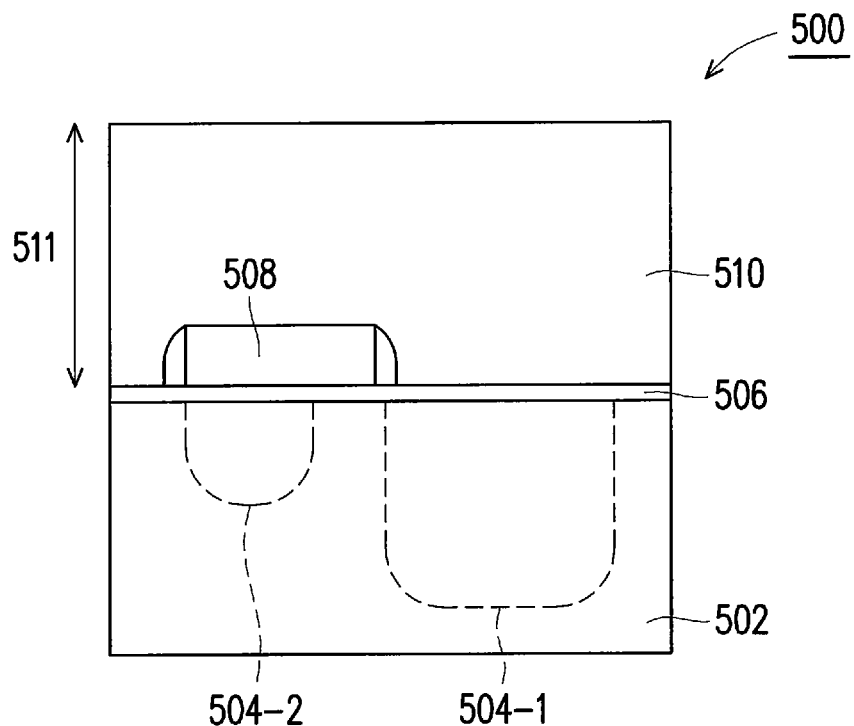

FIG. 5B is a cross-sectional view of a portion of a pixel 300 in a pixel array 200 in a CIS 100 including an interlayer dielectric (ILD) 510 at one of the various stages of fabrication corresponding to operation 404 of FIG. 4, in accordance with some embodiments of the present disclosure. The ILD layer 510 includes a material that is at least one of the following, including silicon oxide, a low dielectric constant (low-k) material, other suitable dielectric material, or a combination thereof. The low-k material may include fluorinated silica glass (FSG), phosphosilicate glass (PSG), borophosphosilicate glass (BPSG), carbon doped silicon oxide ($SiO_xC_y$), Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, and/or other future developed low-k dielectric materials. In some embodiments, the surface of the ILD layer 510 is further planarized through a Chemical-Mechanical Polishing (CMP) process. In some embodiments, the ILD layer 510 after the CMP process has a thickness 511 of a few hundreds of nanometers. In some embodiments, the thickness 511 of the ILD layer 510 is in the range of 550 to 600 nanometers.

Figure 5C:
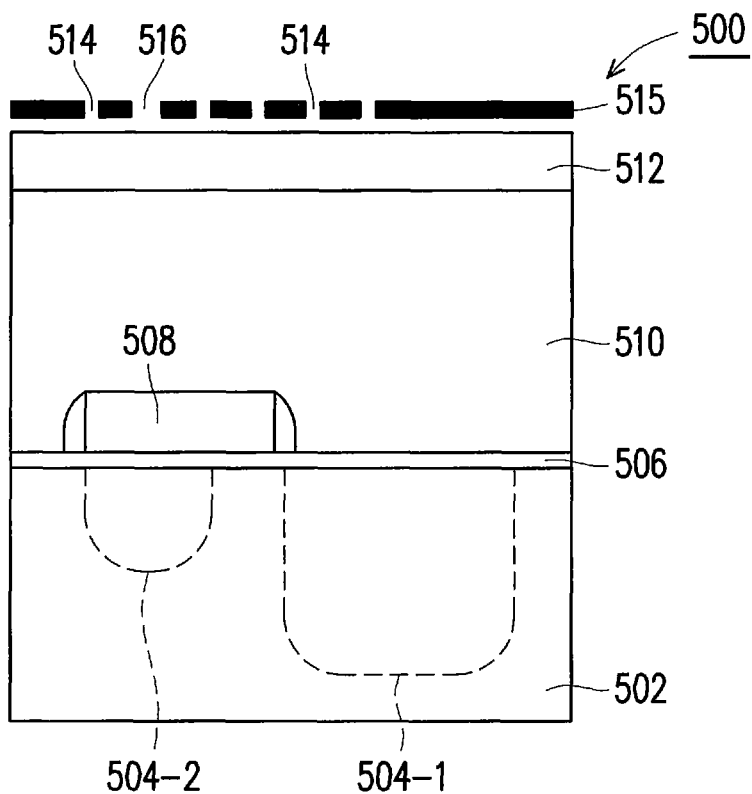

FIG. 5C is a cross-sectional view of a portion of a pixel 300 in a pixel array 200 in a CIS 100 including a photoresist layer 512 and a photomask 515 at one of the various stages of fabrication corresponding to operation 406 of FIG. 4, in accordance with some embodiments of the present disclosure. In some embodiments, the initial photoresist layer 512 has a thickness in a range of 450-520 nanometers. In some embodiments, the photomask 515 comprises a pattern array 514 aligned with the charge-storage region 504-2 for creating a light-shielding structure in the ILD layer 510. In some embodiments, the photomask 515 further comprises an opening 516 aligned with the charge-storage region 504-2 for creating a via contact to the transfer gate 508. In some embodiments, the pattern array 514 in the photomask 515 comprises an array of apertures in an opaque coating (e.g., chromium metal) which allows incident light to go through so as to expose the photoresist layer 512. In some embodiments, a critical dimension of the apertures in the pattern array 514 is smaller than the critical dimension of the aperture in the opening 516. In some other embodiments, the distance between the apertures in the pattern array 514 is less than the distance between the opening 516 and the aperture in the pattern array adjacent to the opening 516. This configuration of the photomask 515 allows to simultaneously pattern the via contact and the light-shielding region in the photoresist layer 512 using one photolithography step, which reduces fabrication cost and improves production yield. In some embodiments, the design of the array of apertures in the pattern array 514 can be adjusted to achieve various light-shielding structures, which will be discussed in detail in FIGS. 6-8.

Figure 5D:
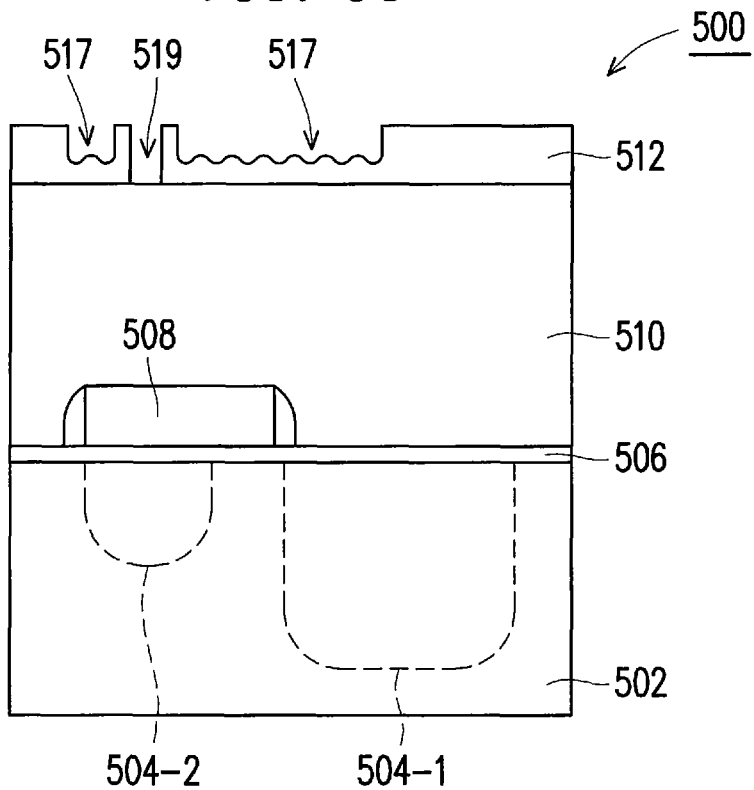

FIG. 5D is a cross-sectional view of a portion of a pixel 300 in a pixel array 200 in a CIS 100 including a patterned photoresist layer 512 at one of the various stages of fabrication corresponding to operation 406 of FIG. 4, in accordance with some embodiments of the present disclosure. In some embodiments, the patterned photoresist layer 512 comprises a shallow-etched region 517 and a through-hole region 519 corresponding to the aperture array 514 and the opening 516 in the photomask 515, respectively. In some embodiments, the shallow-etched region 517 is created in the photoresist layer 512 simultaneously with the through-hole opening 519. The surface of the ILD layer 510 is exposed in the through-hole region 516, while the surface of the ILD layer 510 is covered by the photoresist layer 512 in the shallow-etched region 517. By designing and adjusting the critical dimension and pitch size of the aperture array 514 in the photomask 515, considering the wavelength and power of the UV light for exposure and dielectric properties of the photoresist layer 512, geometries of the partially exposed area 517 under the pattern array 512 can be controlled, wherein the geometries include at least one of the following: thickness of the partially exposed photoresist layer, wrinkle-to-wrinkle distance, and height of wrinkles.

In some embodiments, the exposed photoresist layer 512 is then developed. In some embodiments, the exposed portions of the photoresist layer 512 may be removed by one or more chemical cleaning processes using acetone, 1-Methyl-2-pyrrolidon (NMP), Dimethyl sulfoxide (DMSO), or other suitable removing chemicals. In some embodiments, the chemicals used may need to be heated to temperatures higher than room temperature to effectively dissolve the patterned photoresist layer 512. The selection of the remover is determined by the type and chemical structure of the exposed photoresist layer 512, the ILD layer 510, as well as the substrate 502 to assure the chemical compatibility of these layers with the chemical cleaning process. In some embodiments, this cleaning process is then followed by a rinsing process using isopropyl alcohol or the like, followed by rinsing using deionized water.

In some embodiments, the patterning process of the photoresist layer 512 comprises using an ultraviolet (UV) light source with a wavelength of 248 nanometers operating at a power in a range of 650-750 Watts for the exposure of the photoresist layer 512 for 0.5-1.2 second. The exposed photoresist layer 512 is then developed for 6-11 seconds. In the illustrated embodiments, the patterning process of the photoresist layer 512 is able to simultaneously create a through-hole opening 519 in the photoresist layer 512 for electrically contacting the transfer gate 508 and the shallow-etched region 514 in which the photoresist layer 512 is partially removed and thinned down partially due to the geometry of the aperture array 514 in the photomask 515.

Figure 5E:
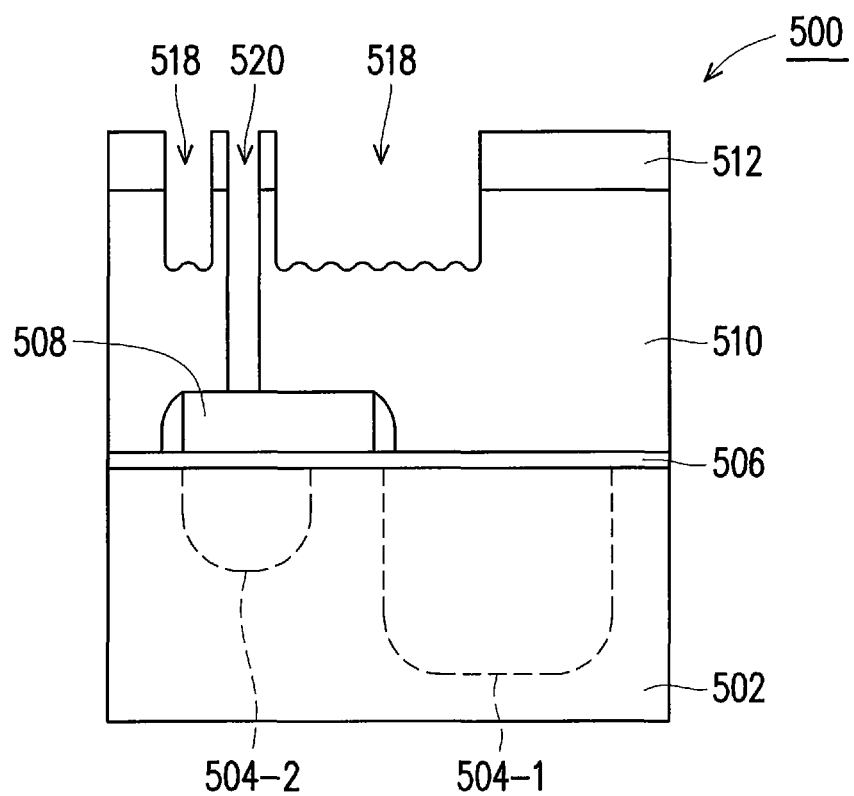

FIG. 5E is a cross-sectional view of a portion of a pixel 300 in a pixel array 200 in a CIS 100 including a patterned ILD layer 510 at one of the various stages of fabrication corresponding to operation 408 of FIG. 4, in accordance with some embodiments of the present disclosure. The ILD layer 510 is etched using a dry-etching process and using the patterned photoresist layer 512 as a hard mask. In some embodiments, the exposed ILD layer 510 under the through-hole opening 519 is completely removed during the dry-etching process to form a through hole 520 that exposes the top surface of the transfer gate 508 for contact purposes. During the dry-etching process, the ILD layer 510 under the shallow-etched region 517 is also partially thinned down to create shallow etched regions 518 after the residual photoresist layer 512 is removed during the same dry etching process. In some embodiments, the wrinkles that were present at the bottom of shallow-etched region 517 in the photoresist layer 512 is also transferred to the bottom of the shallow etched regions 518 of the partially etched ILD layer 510.

Figure 5F:
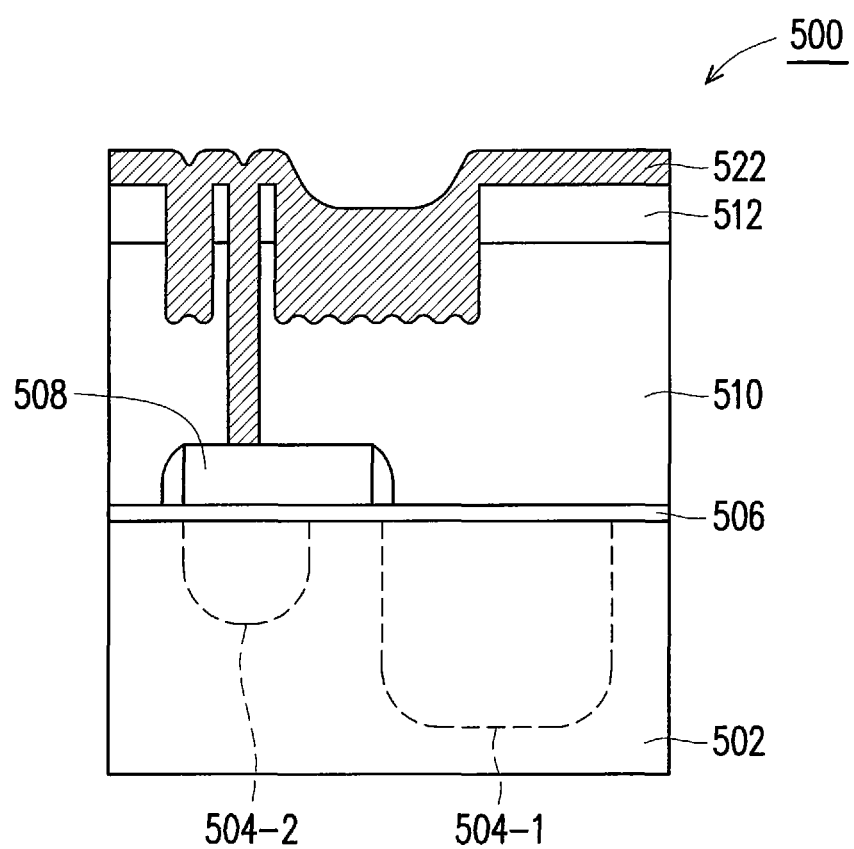

FIG. 5F is a cross-sectional view of a portion of a pixel 500 in a pixel array 200 in a CIS 100 including a metal layer 522 at one of the various stages of fabrication corresponding to operation 410 of FIG. 4, in accordance with some embodiments of the present disclosure. In some embodiments, the metal layer 522 comprises a tungsten (W) metal. In some embodiments, the metal layer 522 fills the through-hole opening 520 and the shallow-etched region 518 in the ILD layer 510. The metal layer 522 is further deposited on the surface of the patterned photoresist layer 512. In some embodiments, the metal layer 522 is deposited using a PVD process such as sputtering, and e-beam evaporation.

Figure 5G:
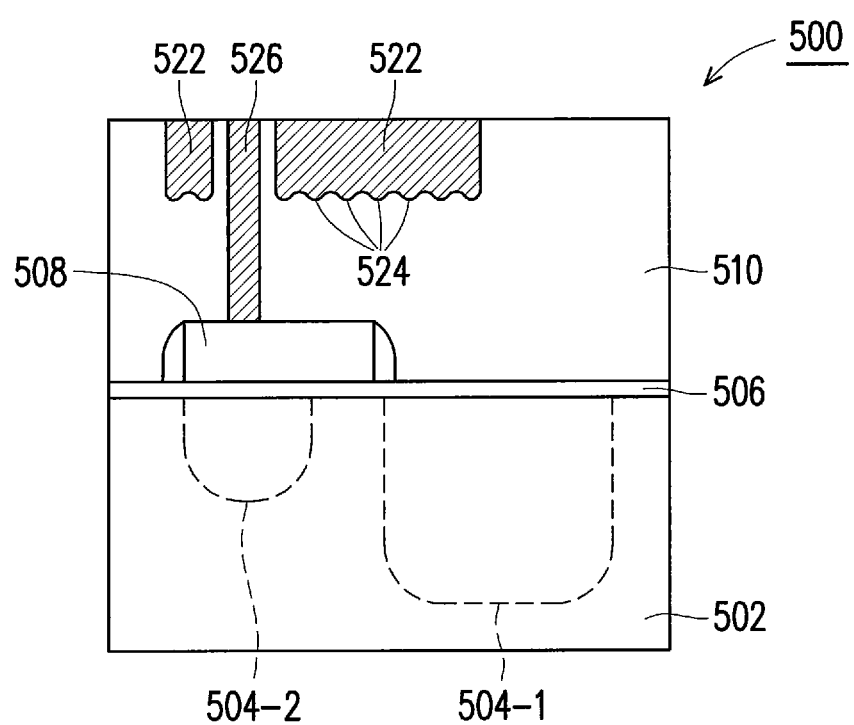

FIG. 5G is a cross-sectional view of a portion of a pixel 300 in a pixel array 200 in a CIS 100 including a light-shielding structure 522 and a via contact in the ILD layer 510 at one of the various stages of fabrication corresponding to operation 410 of FIG. 4, in accordance with some embodiments of the present disclosure. In some embodiments, the photoresist layer 512 covered by the metal coating is removed using acetone, 1-Methyl-2-pyrrolidon (NMP), or Dimethyl sulfoxide (DMSO) followed by a lift-off of the metal layer 522 that is in direct contact with the patterned photoresist layer 512. In some embodiments, the surface of the IDL layer 510 is further polished through a CMP process, after which the surface of the light-shielding structure 522, the via contact 526, and the surface of the ILD layer 510 are coplanar. Furthermore, the via contact 526 and the light-shielding structure 522 are electrically isolated, as shown in FIGS. 3A and 3B. Although not illustrated in FIGS. 5A-5G, it should be noted via contacts to function gates and active devices as well as the grounding contacts in the pixel 300 can be fabricated through the method 500, which are within the scope of this invention.

Figure 6A:
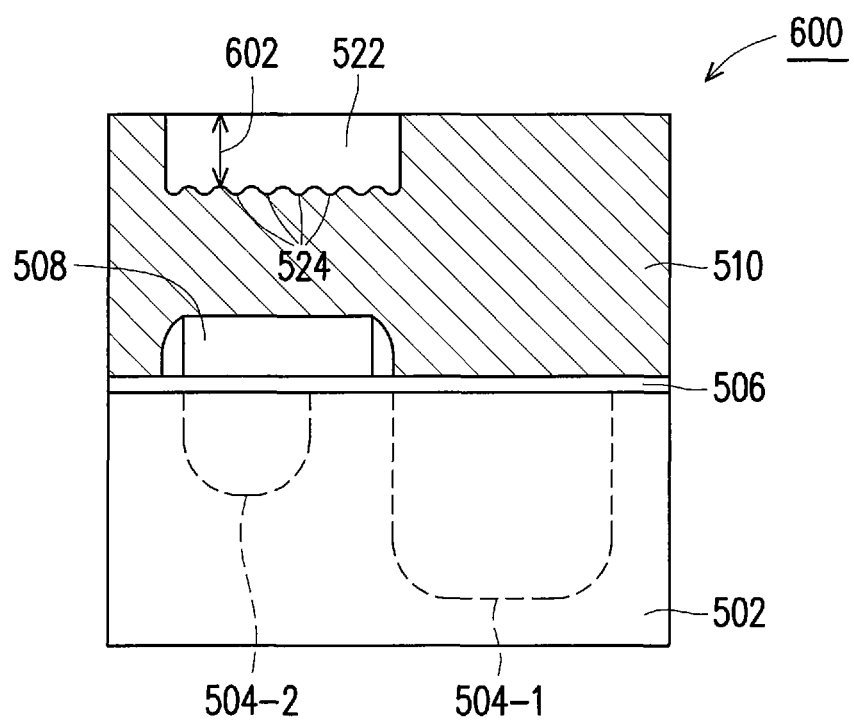
FIG. 6A illustrates an exemplary cross-sectional view of a portion of a pixel in a pixel array of a CIS, in accordance with some embodiments of the present disclosure.

FIG. 6A illustrates an exemplary cross-sectional view of a portion of a pixel 300 in a pixel array 200 of a CIS 100, in accordance with some embodiments of the present disclosure. In the illustrated embodiment, the pixel 300 comprises a light sensing region 504-1, a charge storage region 504-2, and a transfer gate 508. The pixel 300 further comprises an ILD layer 510 and a light-shielding structure 522 in the ILD layer 510. It should be noted that via contacts to the transfer gate 508 together with other via contacts to other active components including transistors, function gates, etc and grounding contacts are not shown for clarity purposes.

In some embodiments, the light-shielding structure 522 is aligned with the charge-storage region 504-2 and the transfer gate 508 in the substrate 502 to prevent light leakage to these areas. In some embodiments, the light-shielding structure 522 and the ILD layer 510 are coplanar. In some embodiments, the thickness 602 of the light-shielding structure 522 is equal to or greater than 150 nm. In some embodiments, the light-shield structure 522 comprises a plurality of wrinkles 524 are the bottom of the light-shielding structure 522.

Figure 6B:
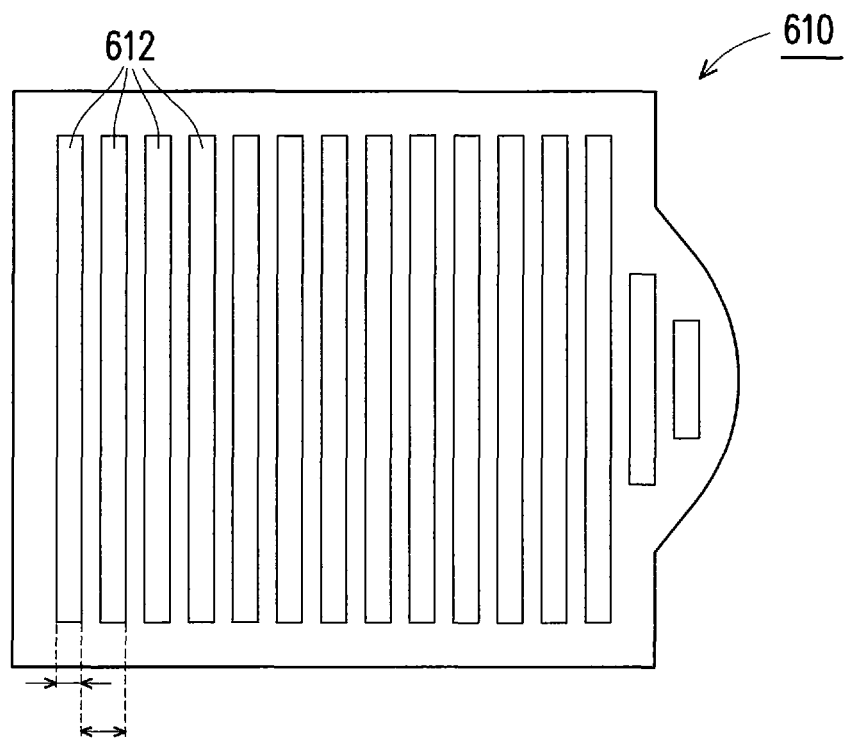
FIGS. 6B-6C illustrate exemplary top views of a portion of a photomask for patterning the light-shielding structure in an interlayer dielectric (ILD) layer shown in FIG. 6A, in accordance with some embodiments of the present disclosure.
Figure 6C:
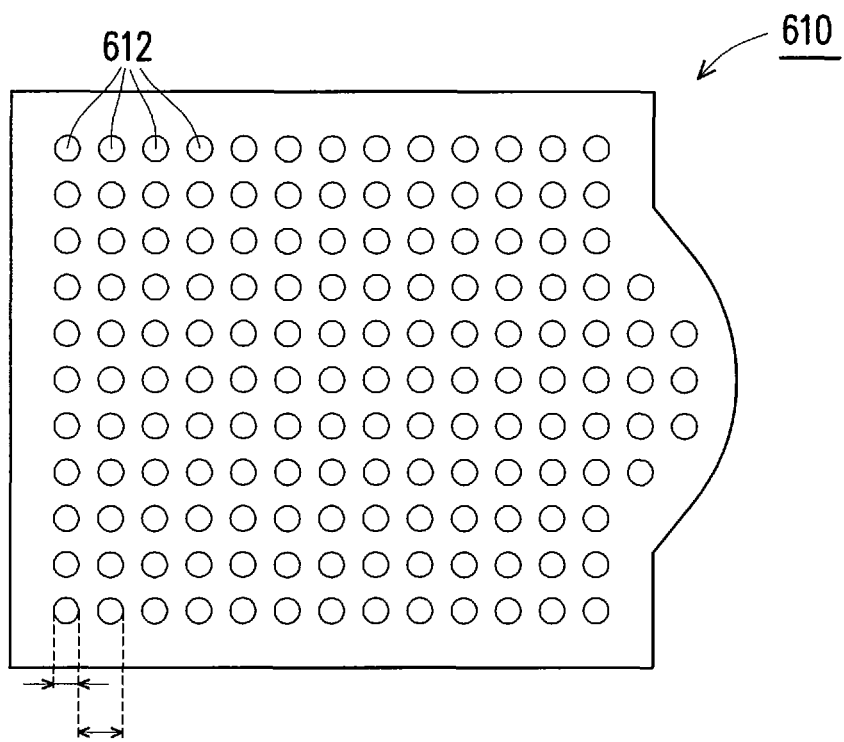

FIGS. 6B-6C illustrate exemplary top views of a portion of a photomask 610 for patterning the light-shielding structure 522 in an interlayer dielectric (ILD) layer shown in FIG. 6A, in accordance with some embodiments of the present disclosure. In the illustrated embodiment, the photomask 610 comprises an array of apertures 612 in an opaque coating (e.g., chromium metal) which allows incident light to go through the apertures 612 so as to expose a photoresist layer as discussed in FIGS. 5A-5G. The critical dimension of the array of apertures 612 (e.g., diameter of holes 612 or width of slits 612) is less than or equal to 160 nanometers and a pitch size of the array is less than or equal to 260 nanometers. When incident light goes through the photomask 610 with small and closely arranged apertures 612, light wave spreads out, i.e., light diffraction occurs, causing a partial exposure of the photoresist layer that is not directly under the apertures 612. Diffracted light waves from neighboring apertures 612 may further cause interference in the photoresist layer in the area that is covered by the opaque coating and between the neighboring apertures 612.

Figure 7A:
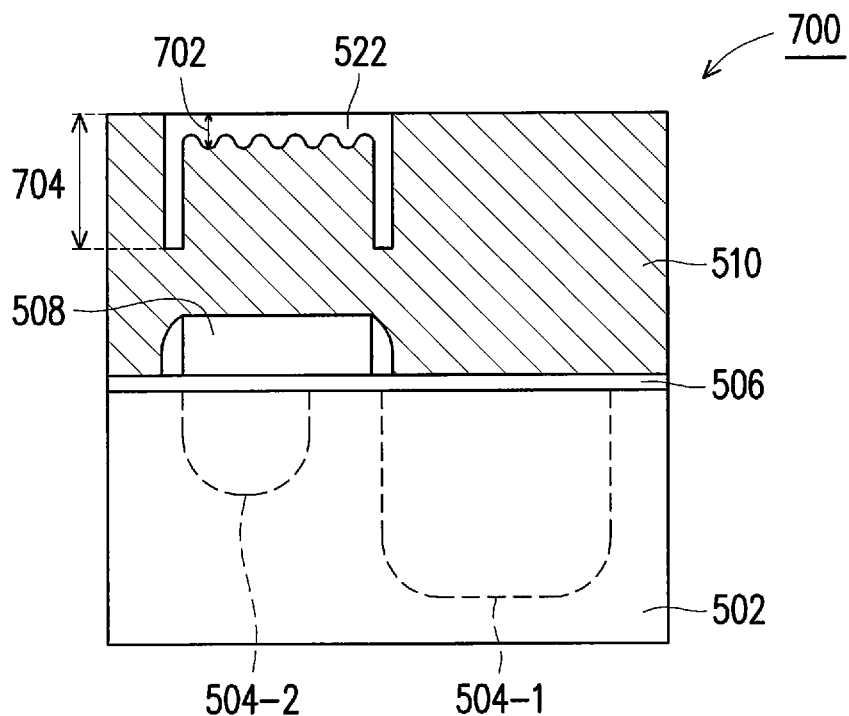
FIG. 7A illustrates an exemplary cross-sectional view of a portion of a pixel in a pixel array of a CIS, in accordance with some embodiments of the present disclosure.

FIG. 7A illustrates an exemplary cross-sectional view of a portion of a pixel 700 in a pixel array 200 of a CIS 100, in accordance with some embodiments of the present disclosure. In the illustrated embodiment, the pixel 700 comprises a light-sensing region 504-1, a charge-storage region 504-2, and a transfer gate 508. The pixel 700 further comprises an ILD layer 510 and a light-shielding structure 522 in the ILD layer 510. It should be noted that via contacts to the transfer gate 508 together with other via contacts to other active components including transistors, function gates, etc and grounding contacts are not shown for clarity purposes.

In some embodiments, the light-shielding structure 522 is aligned with the charge-storage region 504-2 and the transfer gate 508 in the substrate 502 to prevent light leakage to these areas. In some embodiments, the light-shielding structure 522 and the ILD layer 510 are coplanar. In some embodiments, the thickness 702 of the light-shielding structure 522 is equal to or greater than 150 nm. In some embodiments, the light shield structure 522 comprises wrinkles 524 are the bottom of the light-shielding structure 522. In some embodiments, the wrinkles 524 has a wrinkle-to-wrinkle distance of 0-180 nanometers. In some embodiments, the light-shielding structure 522 further comprises a wall at the edges with a height 704 greater than the thickness 702 of the light-shielding structure.

Figure 7B:
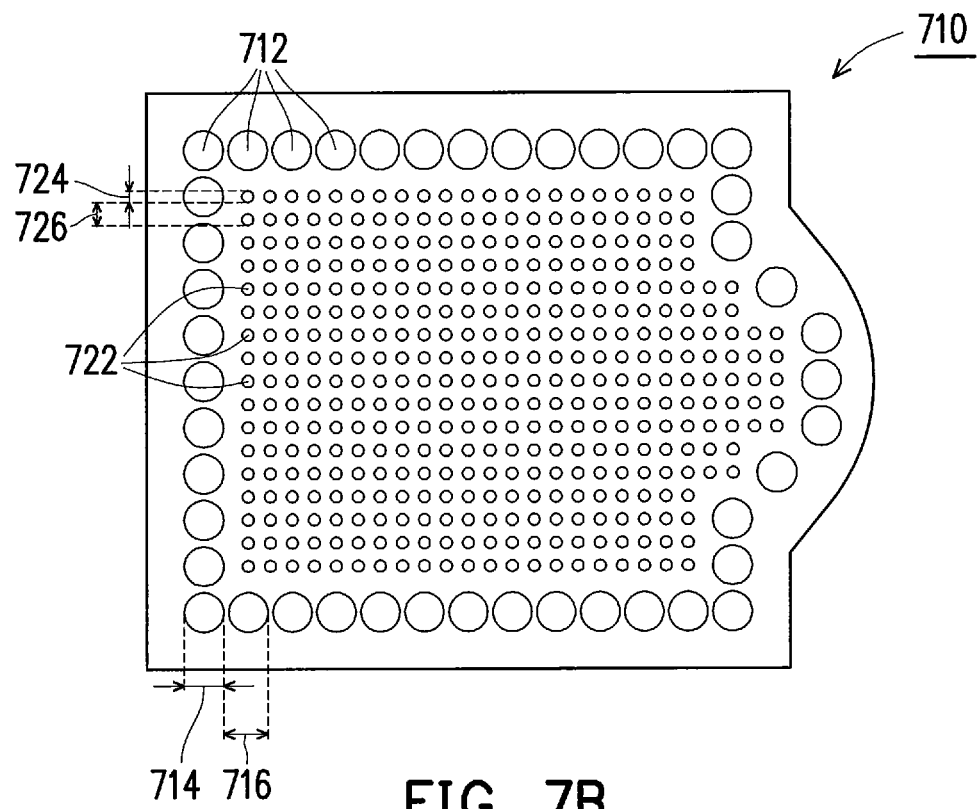
FIG. 7B illustrates an exemplary top view of a portion of a photomask for patterning the light-shielding structure in an interlayer dielectric (ILD) layer shown in FIG. 7A, in accordance with some embodiments of the present disclosure.

FIG. 7B illustrates an exemplary top view of a portion of a photomask 710 for patterning the light-shielding structure 522 in an interlayer dielectric (ILD) layer 510 shown in FIG. 7A, in accordance with some embodiments of the present disclosure. In the illustrated embodiment, the photomask 710 comprises an array of apertures 712/722 in an opaque coating (e.g., chromium metal) which allows incident light to go through the apertures 712/722 so as to expose a photoresist layer as discussed in FIGS. 5A-5G. The critical dimension of the array of apertures 712/722 (e.g., diameter of holes or width of slits) is less than or equal to 160 nanometers and a pitch size of the array is less than or equal to 260 nanometers. When incident light goes through the photomask 610 with small and closely arranged apertures 712/722, light wave spreads out, i.e., light diffraction occurs, which causes a partial exposure of the photoresist layer that is not directly under the apertures 712/722. Diffracted light waves from neighboring apertures 712/722 may further cause interference in the photoresist layer in the area that is covered by the opaque coating and between the neighboring apertures 612. In the illustrated embodiment, to create the wall structure at the edges of the light-shielding structure 522, the critical dimension 714 and pitch size 716 of the apertures 712 are greater than the critical dimension 724 and pitch size 726 of the apertures 722, respectively, allowing an improved exposure of the photoresist layer under the apertures 712 compared to that under the apertures 722 and more complete removal of the photoresist during the developing process compared to that under the apertures 722.

Figure 8A:
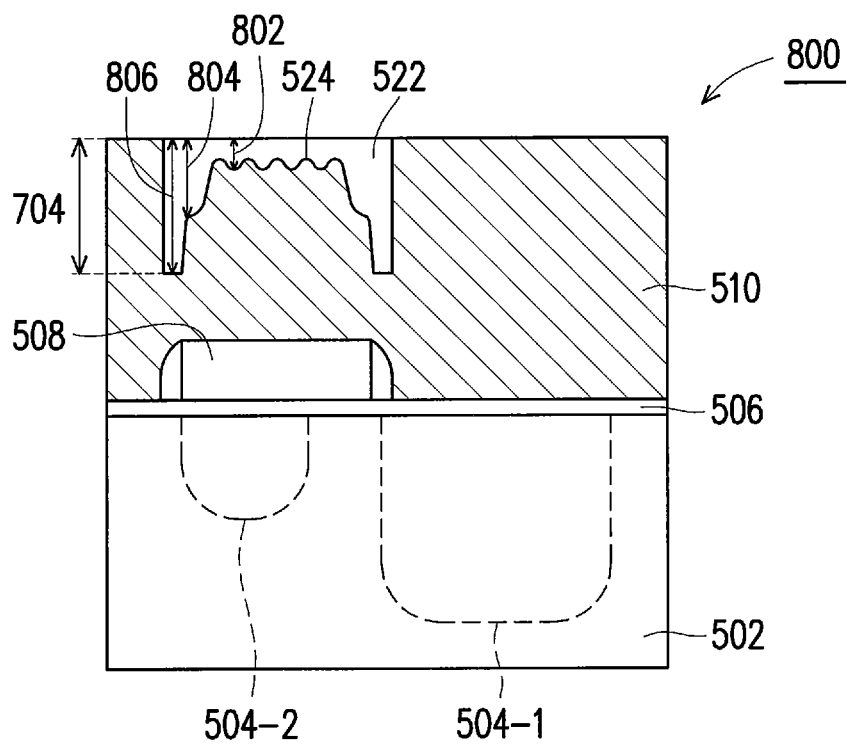
FIG. 8A illustrates an exemplary cross-sectional view of a portion of a pixel in a pixel array of a CIS, in accordance with some embodiments of the present disclosure.

FIG. 8A illustrates an exemplary cross-sectional view of a portion of a pixel 800 in a pixel array 200 of a CIS 100, in accordance with some embodiments of the present disclosure. In the illustrated embodiment, the pixel 800 comprises a light-sensing region 504-1, a charge-storage region 504-2, and a transfer gate 508. The pixel 800 further comprises an ILD layer 510 and a light-shielding structure 522 in the ILD layer 510. It should be noted that via contacts to the transfer gate 508 together with other via contacts to other active components including transistors, function gates, etc and grounding contacts are not shown for clarity purposes.

In some embodiments, the light-shielding structure 522 is aligned with the charge storage region 504-2 and the transfer gate 508 in the substrate 502 to prevent light leakage to these areas. In some embodiments, the light-shielding structure 522 and the ILD layer 510 are coplanar. In some embodiments, the thickness 802 of the light-shielding structure 522 is equal to or greater than 150 nm. In some embodiments, the light shield structure 522 comprises wrinkles 524 are the bottom of the light-shielding structure 522. In some embodiments, the wrinkles 524 has a wrinkle-to-wrinkle distance of in a range of 0-180 nanometers. In some embodiments, the light-shielding structure 522 further comprises a wall at the edges with a height 704 greater than the thickness 702 of the light-shielding structure. In the illustrated embodiment, the wall at the edge of the light-shielding structure 522 further comprises a step with a step height 804 greater than the thickness 802 of the light-shielding structure 522 and less than the height 806 of the wall.

Figure 8B:
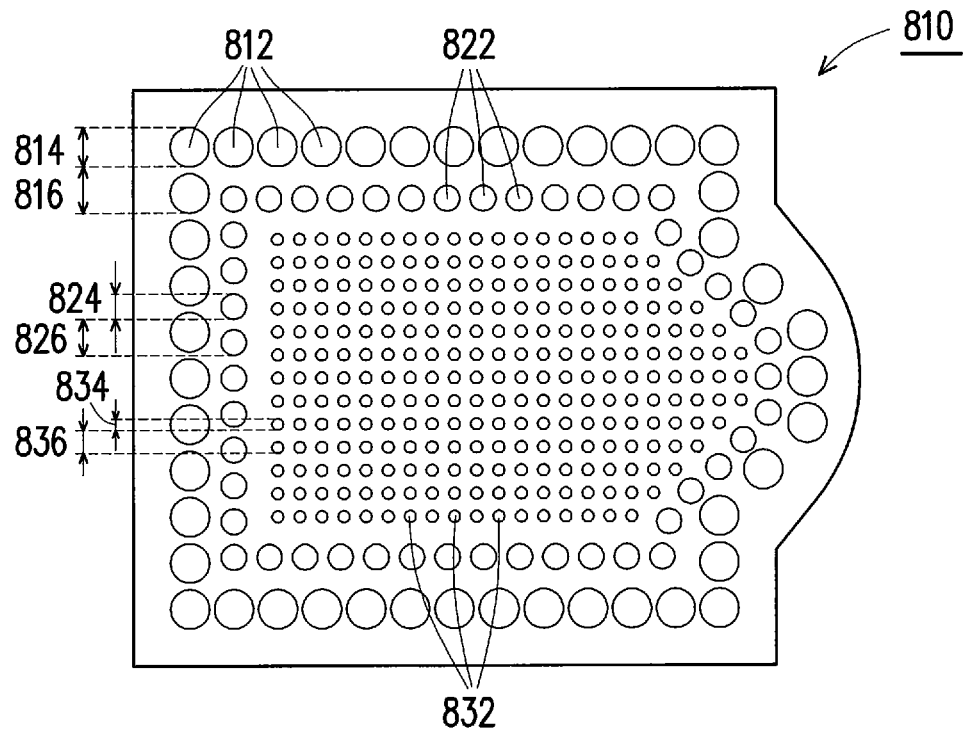
FIG. 8B illustrates an exemplary top view of a portion of a photomask for patterning the light-shielding structure in an interlayer dielectric (ILD) layer shown in FIG. 8A, in accordance with some embodiments of the present disclosure.

FIG. 8B illustrates an exemplary top view of a portion of a photomask 810 for patterning the light-shielding structure 522 in an interlayer dielectric (ILD) layer 510 shown in FIG. 8A, in accordance with some embodiments of the present disclosure. In the illustrated embodiment, the photomask 810 comprises an array of apertures 812/822/824 in an opaque coating (e.g., chromium metal) which allows incident light to go through the apertures 812/822/824 so as to expose a photoresist layer as discussed in FIG. 5. The critical dimension of the array of apertures 812/822/824 (e.g., diameter of holes or width of slits) is less than or equal to 160 nanometers and a pitch size of the array is less than or equal to 260 nanometers. When incident light goes through the photomask 810 with small and closely arranged apertures 812/822/824, light wave spreads out, i.e., light diffraction occurs, which causes a partial exposure of the photoresist layer that is not directly under the apertures 812/822/824. Diffracted light waves from neighboring apertures 812/822/824 may further cause interference in the photoresist layer in the area that is covered by the opaque coating and between the neighboring apertures 812/822/824. In the illustrated embodiment, to create the wall at the edges of the light-shielding structure 522, the critical dimension 814 and pitch size 816 of the apertures 812 are greater than the critical dimension 824 and pitch size 826 of the apertures 822, respectively, allowing an improved exposure of the photoresist layer under the apertures 812 compared to that under the apertures 822. Similarly, to create the step at the edges of the light-shielding structure 522, the critical dimension 824 and pitch size 826 of the apertures 822 are greater than the critical dimension 834 and pitch size 836 of the apertures 832, respectively, allowing an improved exposure of the photoresist layer under the apertures 822 compared to that under the apertures 832.

Figure 9:
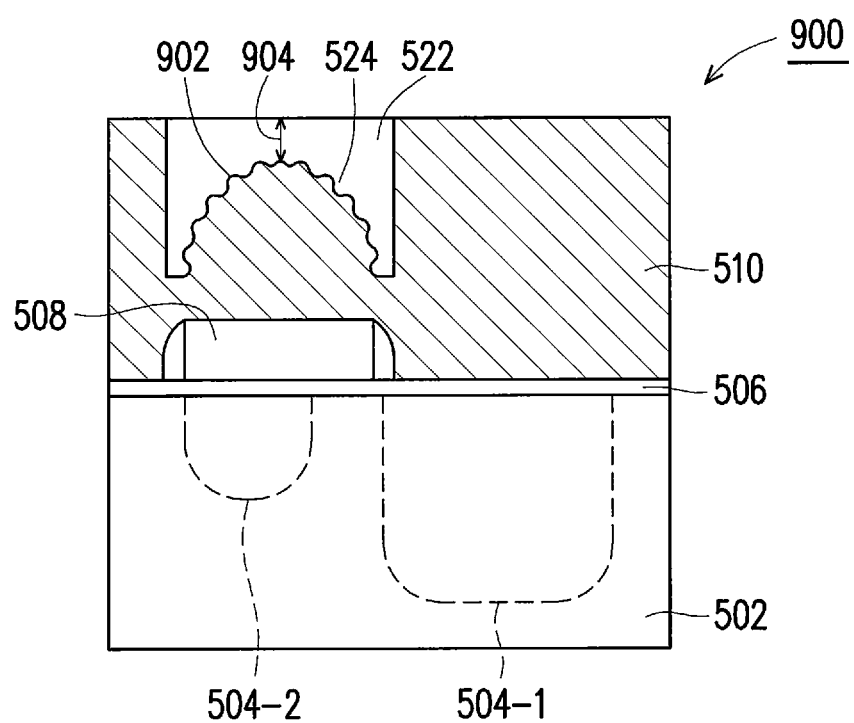
FIG. 9 illustrates an exemplary cross-sectional view of a portion of a pixel in a pixel array of a CIS, in accordance with some embodiments of the present disclosure.

FIG. 9 illustrates an exemplary cross-sectional view 900 of a portion of a pixel 300 in a pixel array 200 of a CIS 100, in accordance with some embodiments of the present disclosure. In the illustrated embodiment, the pixel 300 comprises a light-sensing region 504-1, a charge-storage region 504-2, and a transfer gate 508. The pixel 300 further comprises an ILD layer 510 and a light-shielding structure 522 in the ILD layer 510. It should be noted that via contacts to the transfer gate 508 together with other via contacts to other active components including transistors, function gates, etc and grounding contacts are not shown for clarity purposes.

In some embodiments, the light-shielding structure 522 is aligned with the charge storage region 504-2 and the transfer gate 508 in the substrate 502 to prevent light leakage to these areas. In some embodiments, the light-shielding structure 522 and the ILD layer 510 are coplanar. In some embodiments, the light-shielding structure 522 has a bowl-shaped bottom surface 902, wherein the bowl-shaped bottom surface comprises wrinkles 524. In some embodiments, the light-shielding structure 522 has a thickness 904 measured between the highest point of the bottom surface and the top surface equal to or greater than 150 nanometers.

In one embodiment, a semiconductor device, includes: a light-sensing region, a signal-processing region; and a light-shielding structure, wherein the signal-processing region is spatially configured adjacent to the light-sensing region in a lateral direction, wherein the light shielding structure configured over the signal-processing region in a vertical direction so as to prevent incident light leaking to the signal-processing region from the light-sensing region, and wherein the light-shielding structure is configured in an interlayer dielectric (ILD) layer and simultaneously formed with a plurality of via contacts.

In another embodiment, a Complementary Metal-Oxide-Semiconductor (CMOS) image sensor, comprising: a plurality of pixels configured in a pixel array, wherein each of the plurality of pixels comprises a light-sensing region and a signal processing region, wherein the signal-processing region is spatially configured adjacent to the light-sensing region in a lateral direction, wherein the signal-processing region is configured under a light-shielding structure in a vertical direction so as to prevent incident light leaking to the signal-processing region from the light-sensing region, wherein the light-shielding structure is configured in an interlayer dielectric (ILD) layer and simultaneously formed with a plurality of via contacts.

Yet, in another embodiment, a method for forming a semiconductor device, includes: depositing an interlayer dielectric (ILD) layer on a substrate, wherein the substrate comprises a plurality of pixels configured in a pixel array, and wherein each of the plurality of pixels comprises a light sensing region and a signal processing region; patterning the ILD layer to simultaneously form a first plurality of fully-etched through holes and a first plurality of shallow-etched areas; and depositing a metal layer on the ILD layer to simultaneously form a plurality of via contacts to each of the plurality of pixels in the first plurality of fully-etched through holes and a plurality of light-shielding structures in the first plurality of shallow-etched areas, wherein each of the plurality of light-shielding structures is configured to align with the signal-processing region in a pixel in a vertical direction so as to prevent incident light leaking from the light-sensing region to the signal-processing region.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a light-sensing region;
   a charge-storage region;
   a transfer gate formed over the charge-storage region;
   a light-shielding structure; and
   at least one via contact;
   wherein the charge-storage region is spatially configured adjacent to the light-sensing region in a lateral direction, wherein the light-shielding structure is configured over the charge-storage region in a vertical direction so as to prevent incident light leaking from the light-sensing region to the charge-storage region, wherein the light-shielding structure is configured in an interlayer dielectric (ILD) layer, wherein the light-shielding structure comprises a first surface and a second surface, wherein the first surface is coplanar with the ILD layer, and the second surface comprises a plurality of wrinkles, wherein each of the plurality of wrinkles comprises a respective lower portion that is higher than an upper portion of the transfer gate, and wherein the light-shielding structure is simultaneously formed with the at least one via contact.

2. The semiconductor device of claim 1, wherein the light-shielding structure comprises a first thickness measured between the first surface and a highest point of the second surface, wherein the first thickness is equal to or greater than 150 nanometers.

3. The semiconductor device of claim 1, wherein the light-shielding structure comprises tungsten (W) metal and electrically grounded through at least one grounding contact.

4. The semiconductor device of claim 1, wherein a second thickness of the ILD layer is at least 330 nanometers.

5. The semiconductor device of claim 1, wherein the charge-storage region comprises a charge-storage node.

6. The semiconductor device of claim 1, wherein the light-sensing region comprises a complementary metal-oxide-semiconductor (CMOS) photodiode.

7. The semiconductor device of claim 1, wherein the at least one via contact is configured to provide electrical contacts to the charge-storage region and is electrically isolated from the light-shielding structure, wherein the at least one via contact comprises W metal.

8. A Complementary Metal-Oxide-Semiconductor (CMOS) image sensor, comprising:
a plurality of pixels configured in a pixel array,
wherein each of the plurality of pixels comprises:
   a light-sensing region;
   a charge-storage region formed adjacent to the light-sensing region in a lateral direction;
   a transfer gate formed over the charge-storage region;
   a light-shielding structure formed over the charge-storage region in a vertical direction so as to prevent incident light leaking from the light-sensing region to the charge-storage region, wherein the light-shielding structure is configured in an interlayer dielectric (ILD) layer, wherein the light-shielding structure comprises a first surface and a second surface, wherein the first surface is coplanar with the ILD layer, and wherein the second surface comprises a plurality of wrinkles, wherein each of the plurality of wrinkles comprises a respective lower portion that is higher than an upper portion of the transfer gate; and
   at least one via contact that extends through the ILD layer to contact a top surface of the transfer gate.

9. The CMOS image sensor of claim 8, wherein each of the plurality of light-shielding structures comprises a first thickness measured between the first surface and a highest point of the second surface, wherein the first thickness is equal to or greater than 150 nanometers.

10. The CMOS image sensor of claim 8, wherein the light-shielding structure in each of the plurality of pixels comprises tungsten (W) metal and electrically grounded through at least one grounding contact.

11. The CMOS image sensor of claim 8, wherein a second thickness of the ILD layer is at least 330 nanometers.

12. The CMOS image sensor of claim 8, wherein the charge-storage region comprises a charge-storage node.

13. The CMOS image sensor of claim 8, wherein the at least one via contact is configured to provide electrical contacts to the charge-storage region and is electrically isolated from the light-shielding structure, wherein the at least one via contact comprises W metal.

14. The CMOS image sensor of claim 8, further comprising:
a vertical shift register (VSR) coupled with the pixel array to perform at least one of the following functions, receiving a row address of the pixel array and driving control lines of the pixel array;
a horizontal shift register (HSR) coupled with the pixel array to perform reading output signals from the pixel array;
a timing generator coupled to the pixel array, the VSR and the HSR so as to generate a clock signal for synchronization purposes; and
a voltage regulator coupled to the pixel array, the VSR and the HSR so as to provide voltage control and maintain voltage levels.

15. A semiconductor device, comprising:
a light-sensing region;
a charge-storage region;
a transfer gate formed over the charge-storage region;
a light-shielding structure; and
at least one via contact;
wherein the light-shielding structure is configured in an interlayer dielectric (ILD) layer, and wherein the light-shielding structure is simultaneously formed with the at least one via contact, and wherein the light-shielding structure comprises a first surface and a second surface, the first surface being coplanar with the ILD layer, and the second surface comprises a plurality of wrinkles, wherein each of the plurality of wrinkles comprises a respective lower portion that is higher than an upper portion of the transfer gate.

16. The semiconductor device of claim 15, wherein the charge-storage region is spatially configured adjacent to the light-sensing region in a lateral direction, wherein the light-shielding structure is configured over the charge-storage region in a vertical direction so as to prevent incident light leaking from the light-sensing region to the charge-storage region.

17. The semiconductor device of claim 15, wherein the light-shielding structure comprises tungsten (W) metal and electrically grounded through at least one grounding contact.

18. The semiconductor device of claim 15, wherein a first thickness of the light-shielding structure is at least 150 nanometers, and wherein a second thickness of the ILD layer is at least 330 nanometers.

19. The semiconductor device of claim 15, wherein the charge-storage region comprises a charge-storage node.

20. The semiconductor device of claim 15, wherein the light-sensing region comprises a complementary metal-oxide-semiconductor (CMOS) photodiode.

* * * * *